(12) United States Patent
Teng et al.

(10) Patent No.: US 8,724,337 B2
(45) Date of Patent: May 13, 2014

(54) COMPACT SERVER POWER SUPPLY HAVING HIGH POWER DENSITY

(75) Inventors: Shih-Liang Teng, New Taipei (TW); Wei-Liang Lin, New Taipei (TW); Po-Cheng Teng, New Taipei (TW); Kuo-Chu Yeh, New Taipei (TW)

(73) Assignee: Acbel Polytech Inc., New Taipei (TW)

( * ) Notice: Subject to any disclaimer, the term of this patent is extended or adjusted under 35 U.S.C. 154(b) by 467 days.

(21) Appl. No.: 13/090,948

(22) Filed: Apr. 20, 2011

(65) Prior Publication Data

US 2011/0310558 A1   Dec. 22, 2011

(30) Foreign Application Priority Data

Jun. 21, 2010 (TW) .............................. 99120070 A

(51) Int. Cl.
*H05K 7/20* (2006.01)

(52) U.S. Cl.
USPC ........... 361/760; 361/721; 361/777; 361/796; 361/810; 363/141; 363/146; 363/153; 174/260; 174/520; 174/526

(58) Field of Classification Search
USPC ......... 361/694–695, 715–722, 748, 752, 760, 361/761, 763, 777, 780, 794, 796, 807, 823, 361/830, 836
See application file for complete search history.

(56) References Cited

U.S. PATENT DOCUMENTS

| | | | |
|---|---|---|---|
| 5,365,403 A * | 11/1994 | Vinciarelli et al. ........... | 361/707 |
| 6,867,970 B2 * | 3/2005 | Muller et al. .................. | 361/695 |
| 8,159,820 B2 * | 4/2012 | Ibori et al. ...................... | 361/695 |
| 2002/0006027 A1 * | 1/2002 | Rodriguez et al. ............ | 361/688 |
| 2009/0185352 A1 * | 7/2009 | Ellsworth et al. ............. | 361/720 |
| 2011/0304966 A1 * | 12/2011 | Schrempp .................. | 361/679.4 |

* cited by examiner

*Primary Examiner* — Courtney Smith
(74) *Attorney, Agent, or Firm* — patenttm.us

(57) ABSTRACT

The present invention discloses a compact server power supply having high power density has a casing, a main printed circuit board, a sub-printed circuit board, a power supplying circuit, a power output terminal set and a fan. The power supplying circuit has a primary side circuit unit, a transformer and a secondary side circuit unit. Electric elements of the primary and secondary side circuit units and the transformer are soldered on the main printed circuit board except parts of the electric elements of the secondary side circuit unit are soldered on the sub-printed circuit board. The sub-printed circuit board is vertically mounted and soldered on the main printed circuit board, so the length of the main printed circuit board is shortened to implement the server power supply having a compact size and high power density.

20 Claims, 14 Drawing Sheets

US 8,724,337 B2

COMPACT SERVER POWER SUPPLY HAVING HIGH POWER DENSITY

BACKGROUND OF THE INVENTION

1. Field of the Invention

The present invention relates to the field of a server power supply, and more particularly to a compact server power supply having high power density.

2. Description of Related Art

With reference to FIG. 9A, a redundant power supply for a server has a primary side circuit 70, a transformer 701 and a secondary side circuit 71.

The primary side circuit 70 is electronically connected to an AC power source and decreases voltage of the AC power source.

The transformer 701 has a primary side and a secondary side. The primary side is electronically connected to the primary side circuit 70 and outputs an induced current to the secondary side.

The secondary side circuit 71 is electronically connected to the secondary side of the transformer 701 and converts the induced current to a DC power source. The secondary side circuit 71 has a current doubler and an Oring MOSFET. The current doubler is electronically connected to the secondary side of the transformer 701 and has two electronic switches 721, two inductors 722 and an output capacitor 723. The two electronic switches 721 are electronically connected to the secondary side of the transformer 701 in serial. A serial connecting node between the two electric switches 721 is ground of the DC power source. The two ends of the electronic switches 721 connected to the secondary side are respectively connected to ends of the inductors 722. The other ends of the inductors 722 are connected to a common node. The output capacitor 723 is electronically connected between the common end and the ground of the DC power source. The ORing MOSFET is electronically connected to the common node and a high voltage potential (+12V) of the DC power source.

With further reference to FIG. 9B, another redundant power supply for a server with lower power watt is similar to that of FIG. 9A, but uses another secondary side circuit 71a and a central-tapped transformer 701. The secondary side circuit 71a has a full wave rectifier 72a and an ORing MOSFET 73.

The full wave rectifier 72a has two electronic switches 721, an inductor 722 and an output capacitor 723. The electric switch 721 uses MOSFET having a source, drain and a gate. The sources of the two electric switches 721 are respectively connected to two ends of the secondary side. The two drains of the electric switches 721 are connected to a common node. One end of the inductor 722 is connected to the common. The output capacitor 723 is electronically connected to the other end of the inductor 722 and a central node of the secondary side. The central node of the secondary side of the transformer 701 is ground of the DC power source.

The ORing MOSFET 73 is electronically connected to the common node and a high voltage potential (+12V) of the DC power source.

To implement the detailed circuit of the redundant power supplies, a trace-layout for a printed circuit board has to be created and then electronic elements of the detailed circuit are soldered on the corresponding trace lines on the printed circuit board. With further reference to FIG. 10, a pattern of the trace-layout is shown. Since the redundant power supply has to supply DC power source with high power watt to the server, trace patterns of high voltage potential and ground 822, 823 for the DC power source require large sizes. The transformer 701, the electric switches 721, the inductors 722, the output capacitor 723 and the ORing MOSFET 73 are soldered on corresponding trace lines 821 on the printed circuit board 82.

With reference to FIGS. 11 and 12, a physical redundant power supply having multiple DC power outputs so that the circuit of the power supply has two primary side circuits, two transformers and two secondary side circuits. Therefore, the numbers of the electronic elements of the secondary side circuits are increased for the printed circuit board 82. The power supply has a casing 80, the printed circuit board 82, a fan 83 and a power output terminal set 84.

The casing 80 has a base 801 and a cover 802 mounted on the base 801.

The printed circuit board 82 is mounted in the casing 80, and has trace lines 821 on which the electronic elements soldered and trace patterns of the high voltage potential and ground 822, 823, as shown in FIG. 10.

The fan 83 is mounted next to one short side of the printed circuit board 82 in the casing 80.

The power output terminal set 84 having multiple DC power output terminals is mounted next to the other short side of the printed circuit board 82 in the casing 80 and soldered on the trace patterns of the high voltage potential and ground 822, 823, as shown in FIG. 10.

Since the server power supply requires multiple DC power outputs, the electronic elements of the secondary side circuits, the current doubler or full wave rectifier need more space of the printed circuit board. With reference to FIG. 12, a top plane view of the printed circuit board on which the electronic elements are soldered is shown. The electronic elements include the transistors 721, the inductors 722 and the output capacitors 723 between the transformer and the power output terminal set 84. The output capacitors 723 are lined up and next to one side of the power output terminal set. To reduce the length of the short side of the printed circuit board 82, the transistors 721 are parallel to the output capacitors 723 and vertically facing the power output terminal set 84. However, most server factories produce small servers, so the server power supply factories are required to manufacture compact server power supply. The arrangement of electronic elements on the printed circuit board is not an effective way to reduce the size of the printed circuit board. Therefore, higher power density of the power source is a goal pursued by power supply factory.

Further, different servers require the power supply with different power watts, so the printed circuit boards with different trace layouts are needed. That is, the power supply factories have to stock different printed circuit boards to manufacture different types of power supplies. However, the power supply factories need more storing space to stock the different printed circuit boards and to create different manufacturing processes. Therefore, the manufacturing processes are turning out to be more and more complex.

To overcome the shortcomings, the present invention provides a high power density compact power supply for a server to mitigate or obviate the aforementioned problems.

SUMMARY OF THE INVENTION

The main objective of the present invention is to provide a compact server power supply having high power density The server power supply has a casing, a main printed circuit board, a sub-printed circuit board, a power supplying circuit, a power output terminal set and a fan. The power supplying circuit has a primary side circuit unit, a transformer and a secondary side circuit unit. Electric elements of the primary and secondary side circuit units and the transformer are soldered on the main printed circuit board except parts of the electric elements of the secondary side circuit unit are soldered on the sub-printed circuit board. The sub-printed circuit board is vertically mounted and soldered on the main printed circuit board, so the length of the main printed circuit board is shortened to implement the server power supply having a compact size and high power density.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
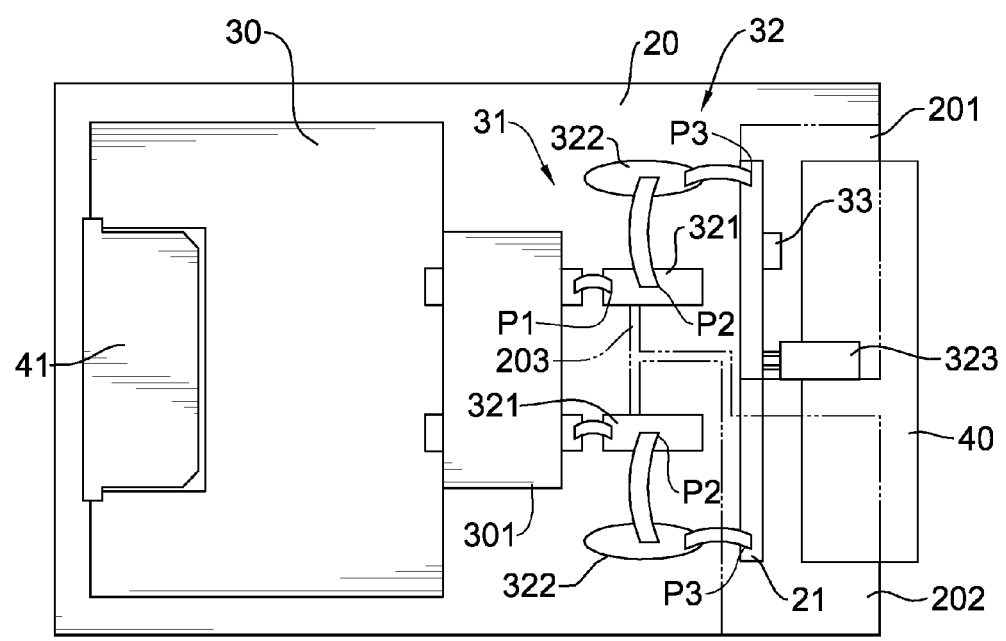
FIG. 1 is a schematic view of a printed circuit board with electronic elements of a first embodiment of a server power supply in accordance with the present invention.
Figure 3:
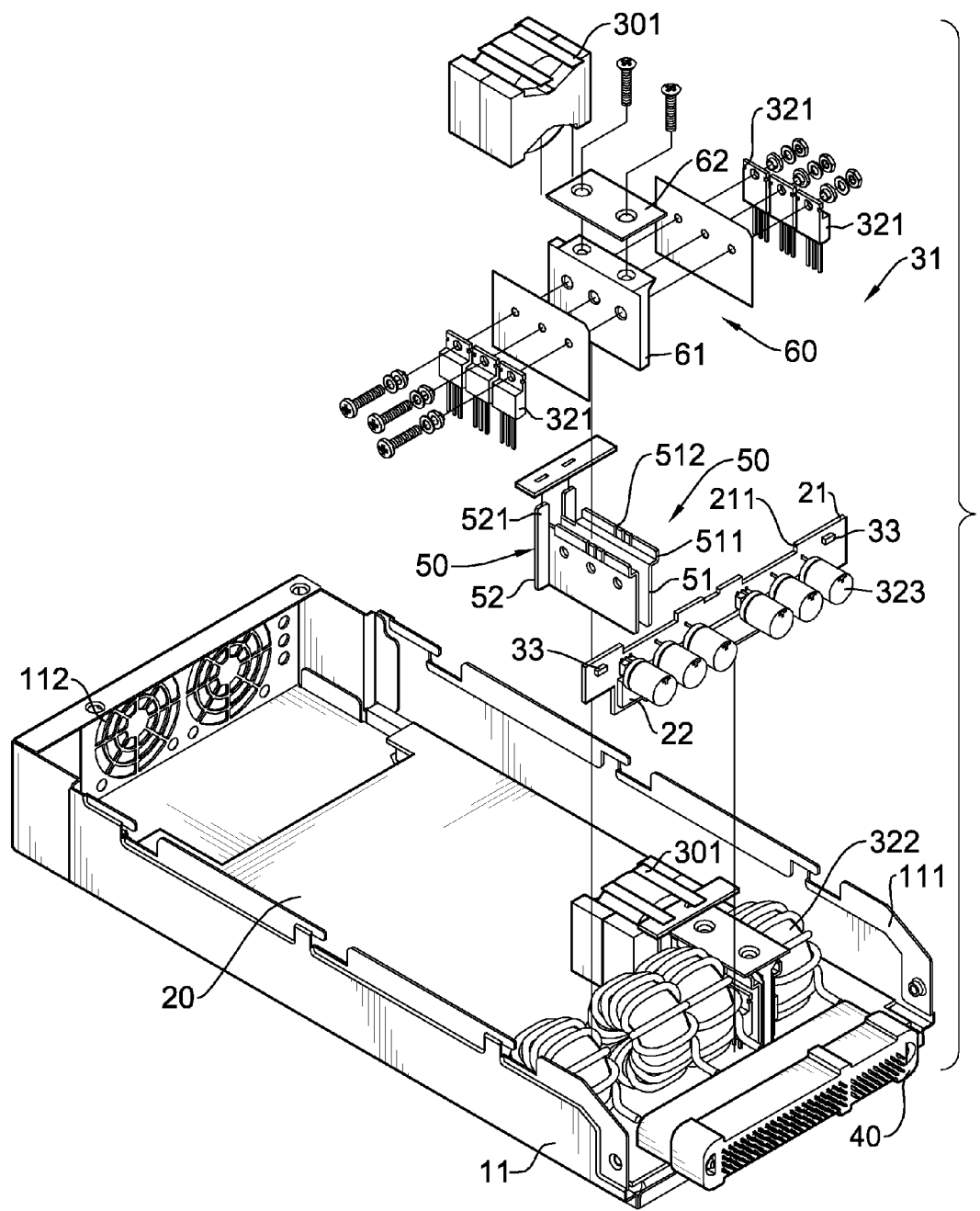
FIG. 3 is an exploded perspective view in partial of FIG. 2.

With reference to FIGS. 1 and 3, a first embodiment of a server power supply in accordance with the present invention has a casing 10, a main printed circuit board 20, a sub-printed circuit board 21, a power supplying circuit, a power output terminal set 40 and at least one fan 41.

The main printed circuit board 20 has a trace layout having trace wires 203, a trace pattern of a high voltage potential 201 and a trace pattern of ground 202.

The sub-printed circuit board 21 is vertically mounted on the main printed circuit board 20.

The power supplying circuit has a primary side circuit unit 30, a transformer 301 and a secondary side circuit unit 31. The transformer 301 has a primary side and a secondary side. The primary side is electronically connected to the primary side circuit unit 30 and the secondary side is electronically connected to the secondary side circuit unit 31. In the first embodiment, the secondary side circuit unit 31 has a current doubler 32, and an ORing MOSFET 33. The current doubler 32 has two electric switches 321, two inductors 322, and an output capacitor 323. The primary side circuit unit 30, the transformer 301 and the secondary side circuit unit 32 are soldered on the main printed circuit board 30, except the output capacitor 323 and ORing MOSFET 33. The output capacitor 323 and the ORing MOSFET 33 are soldered on the sub-printed circuit board 21. In the first embodiment, the output capacitor 323 is vertically soldered on the sub-printed circuit board 20. If the transformer 301 uses a central-tapped transformer, the secondary side circuit has a full wave rectifier and an ORing MOSFET. The full wave rectifier has two electric switches, an inductor and an output capacitor.

The power output terminal set 40 is mounted on one short side of the main printed circuit board 20 and soldered to the trace pattern of high voltage potential 201 and the trace pattern of ground 202. In the first embodiment, the output power terminal set 40 is located under the output capacitor 323 soldered on the sub-printed circuit board 21.

The at least one fan 41 is mounted on the other short side of the main printed circuit board 20.

Since the output capacitor 323 and the ORing MOSFET 33 are soldered on the sub-printed circuit board 21, the output capacitor 323 and the ORing MOSFET 33 are stacked on the power output terminal set 40. The output capacitor 323 and the ORing MOSFET 33 do not occupy space of the main printed circuit board 20 between the electric switches 321 and the power output terminal set 40 so as to shorten the length of the main printed circuit board 20.

Figure 2:
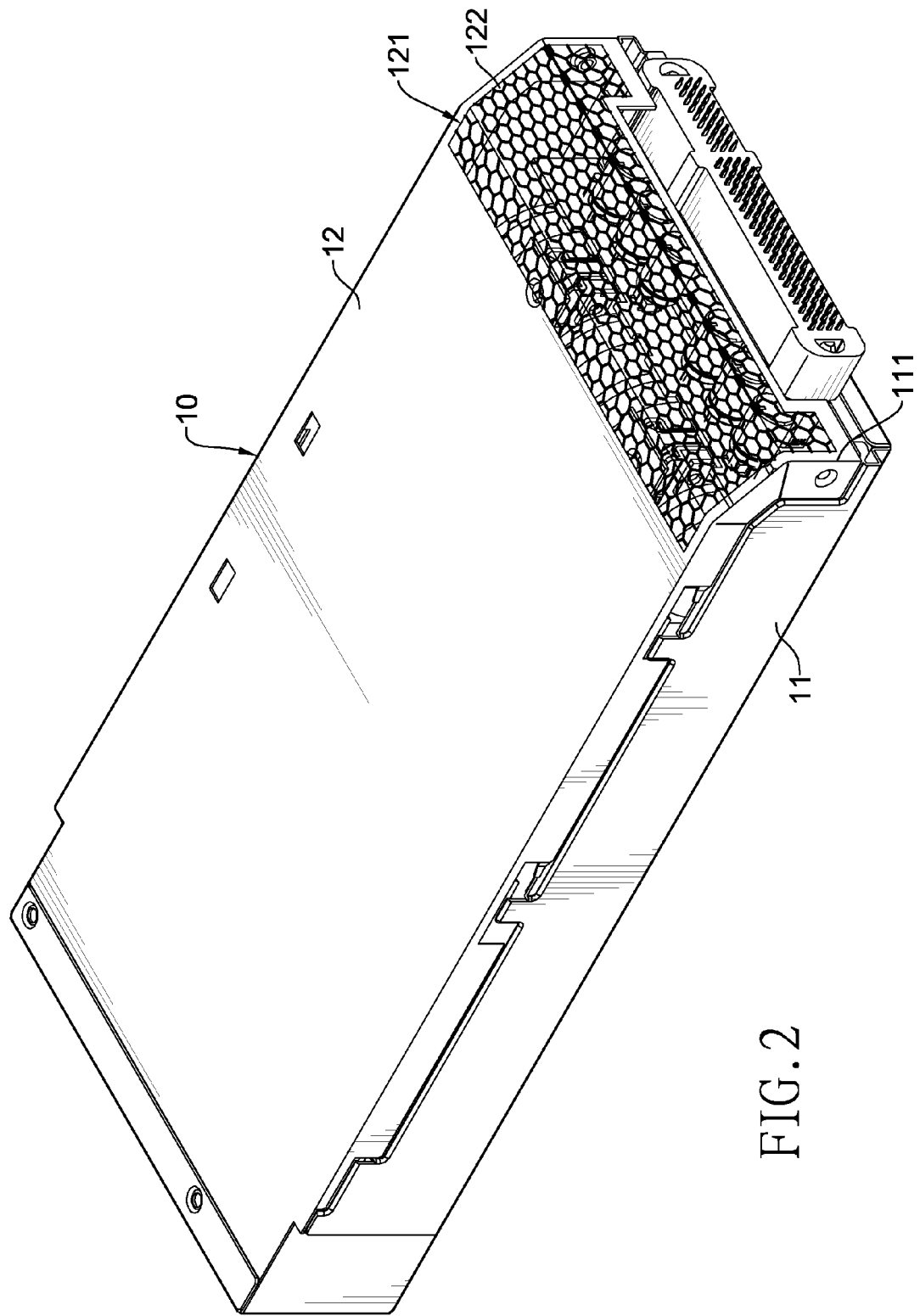
FIG. 2 is a perspective view of a second embodiment of a server power supply in accordance with the present invention.

With reference to FIGS. 2 and 3, a second embodiment of a server power supply with high power watt is similar to the first embodiment, but a power supplying circuit has two primary side circuits, two transformers (or two central-tapped transformers) and two secondary side circuits. Therefore, the server power supply has two current doublers (or two full wave rectifiers) and two ORing MOSFETs. Therefore, the output capacitors 323 and ORing MOSFETs 33 are soldered on the sub-printed circuit board 21 and arranged in one line.

Figure 6:
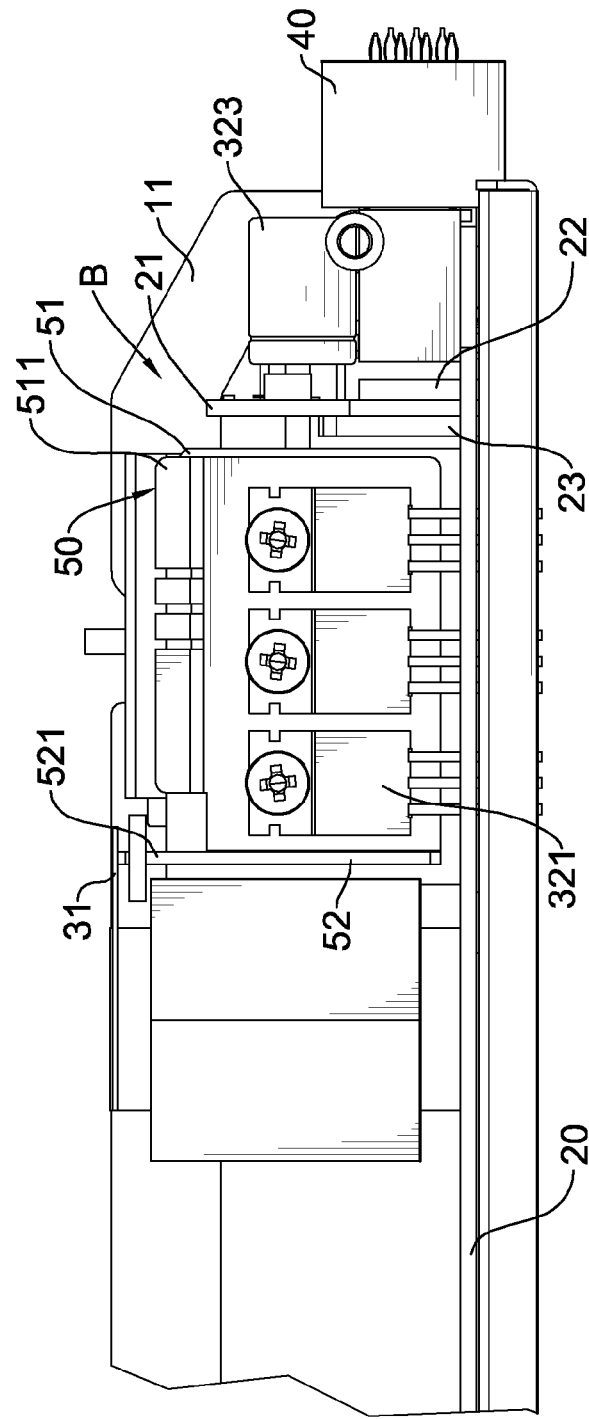
FIG. 6 is a side plan view of FIG. 3.
Figure 8A:
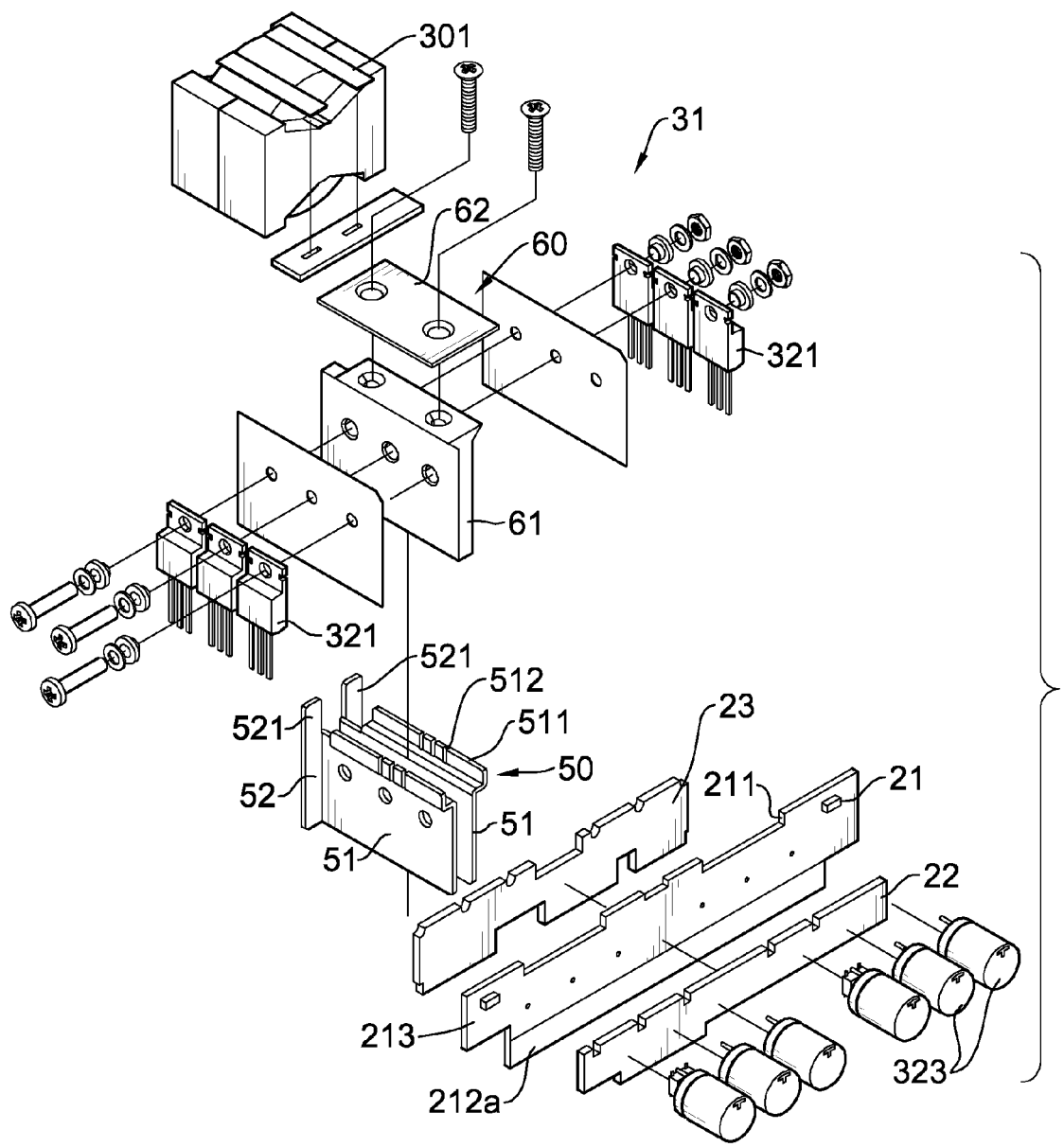
FIG. 8A is another exploded perspective view in partial of FIG. 2.
Figure 8B:
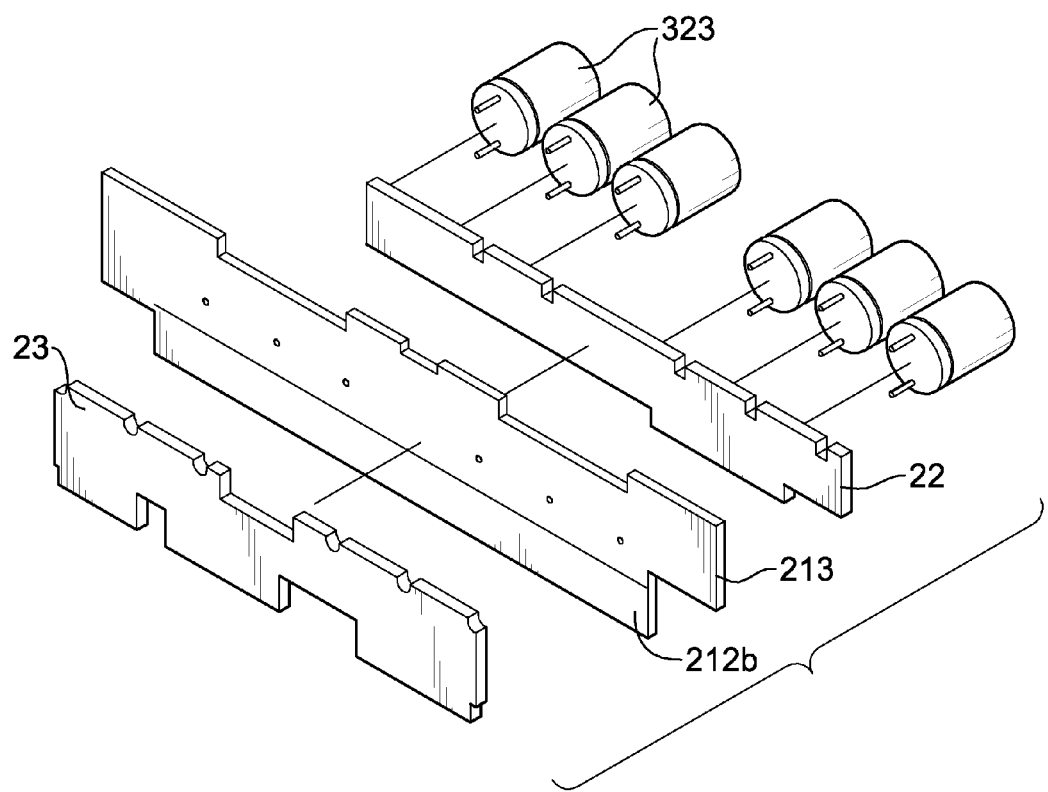
FIG. 8B is another exploded perspective view in partial of FIG. 2.
Figure 9A:
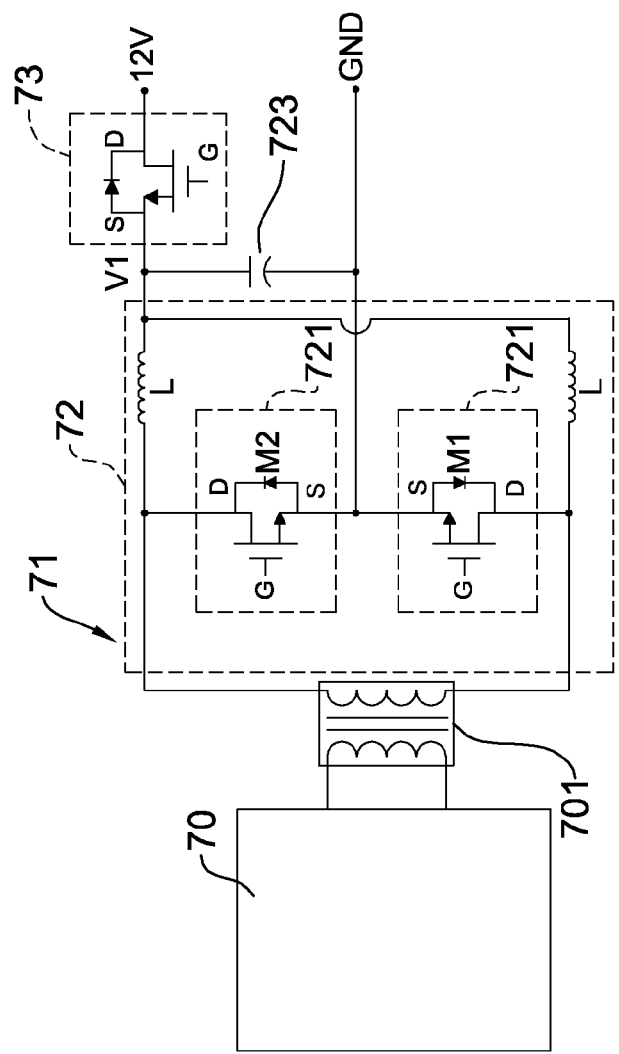
FIG. 9A is a detailed circuit diagram of a server power supply.
Figure 9B:
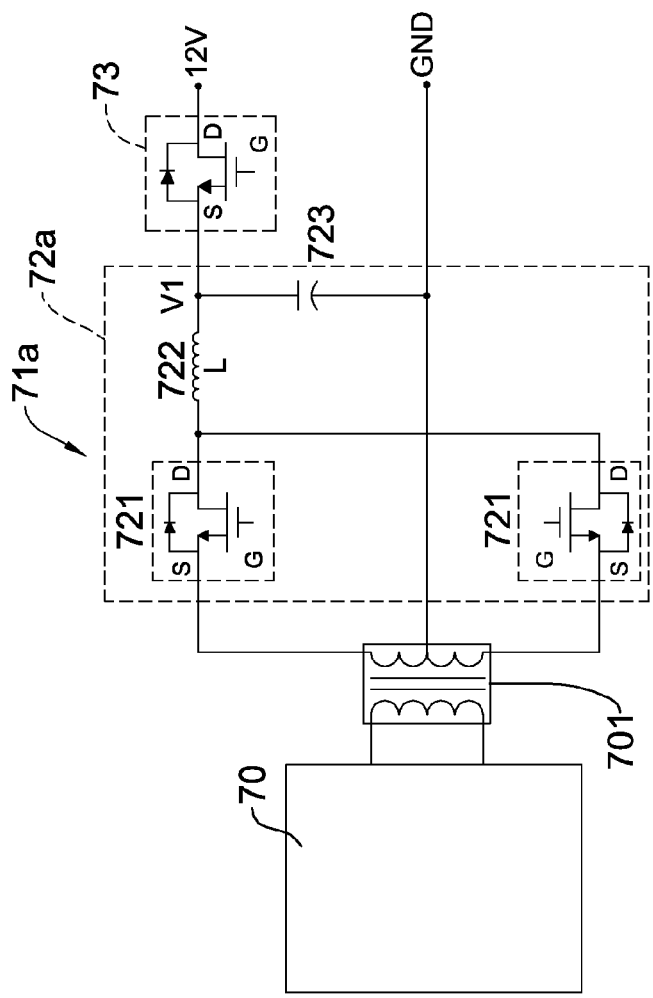
FIG. 9B is a detailed circuit diagram of another server power supply.
Figure 10:
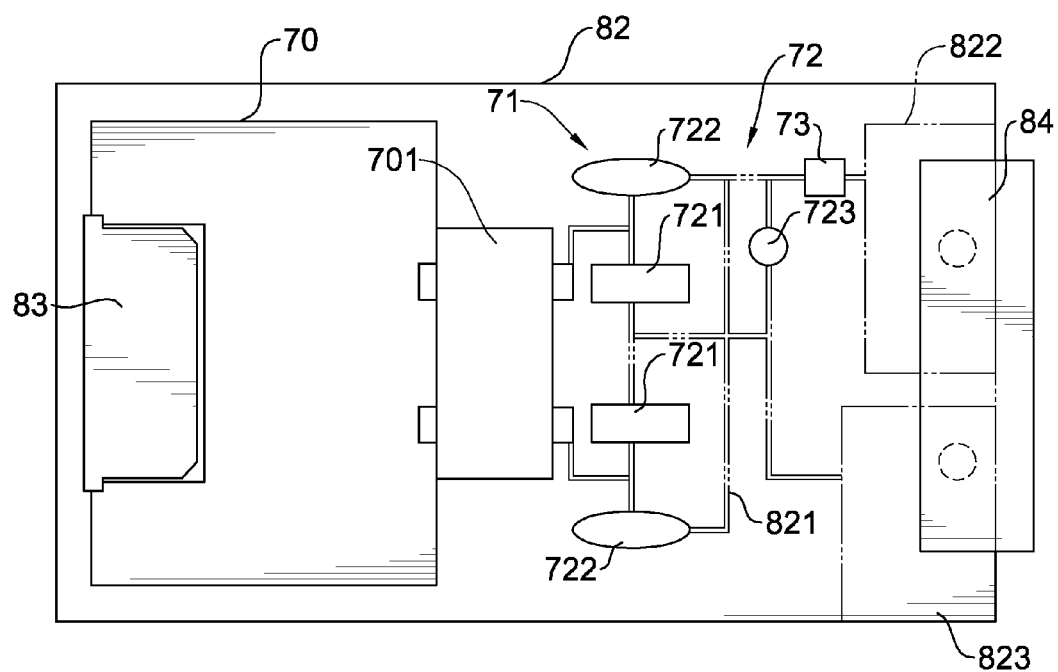
FIG. 10 is a schematic view of a printed circuit board with electronic elements of a conventional server power supply in accordance with the prior art.
Figure 11:
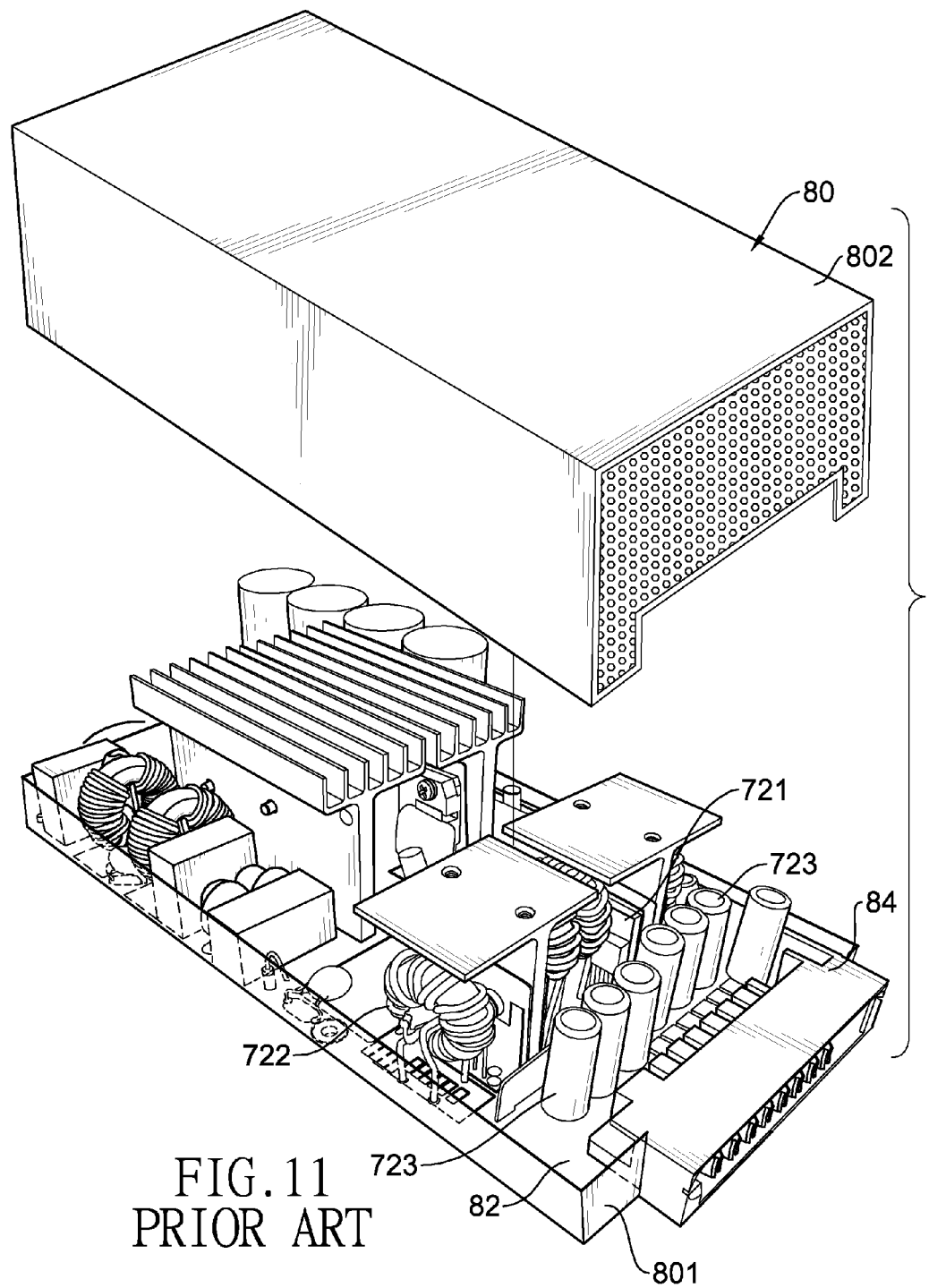
FIG. 11 is an exploded perspective view of another conventional server power supply in accordance with the prior art.
Figure 12:
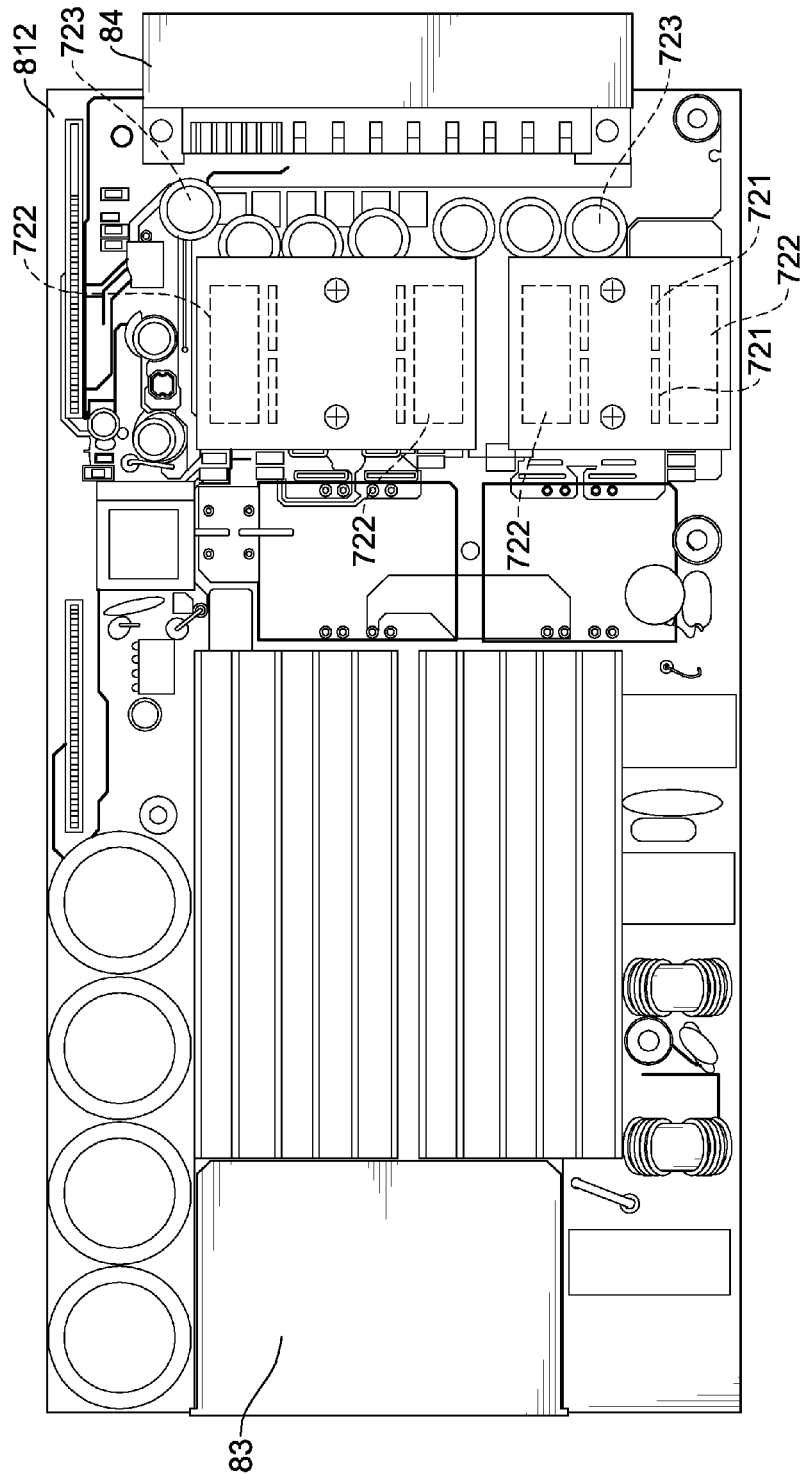
FIG. 12 is a top plan view of a printed circuit board with electronic elements of FIG. 11.

In the first embodiment, with reference to FIGS. 1, 8A and 8B, the sub-printed circuit board 21 is directly soldered on the trace pattern of high voltage potential 201 and the trace pattern of ground 202 on the main printed circuit board 20 by a first metal plate 22 and a second metal plate 23. The first and second metal plates 22, 23 are vertically mounted on the main printed circuit board 20, and respectively soldered on the trace pattern of the high voltage potential 201 and the trace pattern of ground 202. A gap exist between the first and second metal plates 22, 23 and matches with the thickness of the sub-printed circuit board 21. A bottom of the sub-printed circuit board 21 is sandwiched in between the first and second metal plates 22, 23. A trace pattern of high voltage potential 212a and a trace pattern of ground 212b are respectively formed on two opposite sides of the sub-printed circuit board 21. Therefore, the trace pattern of the high voltage potential 212a on the sub-printed circuit board 21 is soldered to the first metal plate 22 and the trace pattern of ground 212b on the sub-printed circuit board 21 is soldered to the second metal plate 23. With further reference to FIG. 6, the distance between the two terminals of each output capacitor 323 and the trace patterns of high voltage potential and ground 201, 202 is reduced and the two terminals of the each output capacitor 323 are not bent. Therefore, the resistance between the output capacitor 323 and the ground is reduced to increase wave-filtering effectiveness and to reduce current conductive loss. In addition, the first and second metal plates 22, 23 may radiate heat generated from the sub-printed circuit board 21. Furthermore, a thickness of the first or second metal plate 22, 23 is selected according to an electrical specification of current or heat for different server power supplies. If the first and second metal plates 22, 23 with different thickness are changed, the main printed circuit 20 is not to be changed so as to implement modular configuration.

Figure 4:
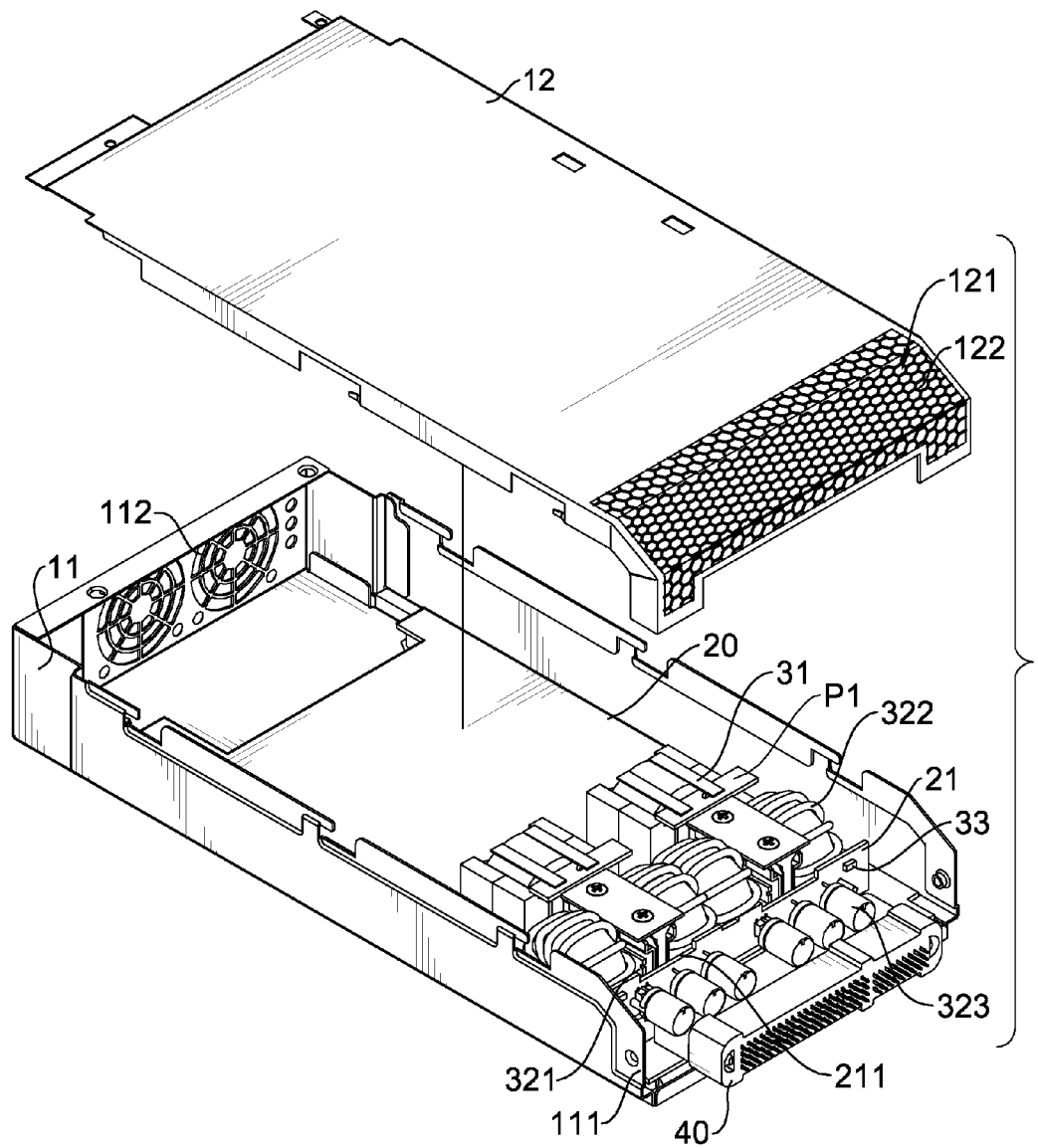
FIG. 4 is an exploded perspective view of FIG. 2.

A top of the sub-printed circuit board 21 is further defined multiple air flow recesses 211 so as to dissipate heat quickly in the casing 10. With reference to FIG. 4, to increase heat-dissipating effectiveness of the server power supply, the casing 10 has a base 11 and a cover 12. The main printed circuit board 20 is mounted on the base 11. The base 11 has a side opening 111 facing the power output terminal set 40 on the main printed circuit board 20, and multiple side heat-dissipating holes 112 facing the fan mounted on the main printed circuit board 20. The cover 12 is mounted on the base 11 and has an incline face 121 corresponding to the side opening 111 of the base 11. The incline face 121 has multiple through holes 122. Therefore, heat from the output capacitors 323, the ORing MOSFETs 33 and the electric switches 321 next to the power output terminal set 40 is quickly dissipated through the through holes 122 of the incline face 121 of the cover 12.

Figure 5:
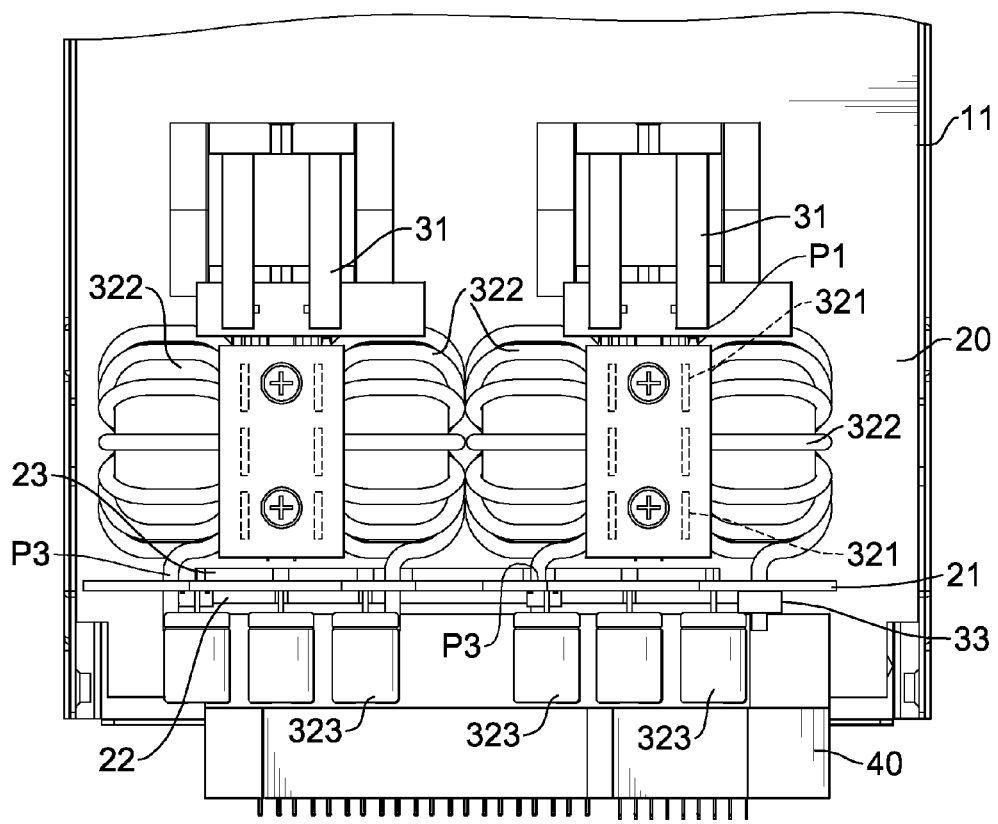
FIG. 5 is a top plan view in partial of FIG. 3.
Figure 7:
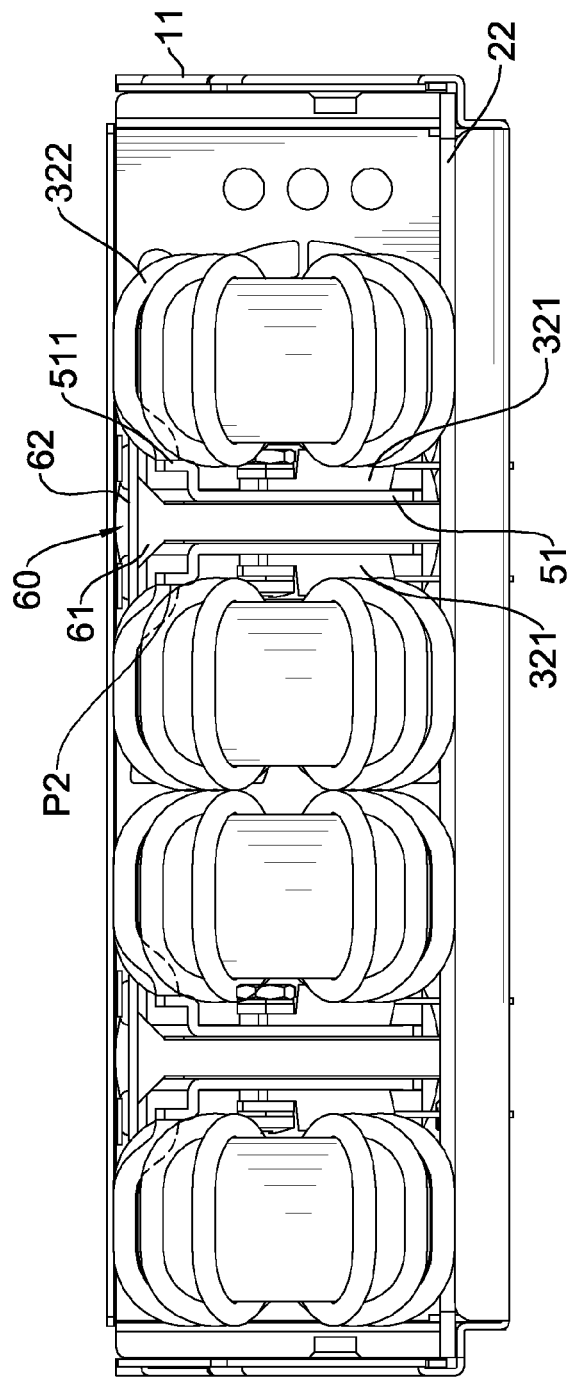
FIG. 7 is a front plan view of FIG. 3.

In the first embodiment, each electric switch 321 may be a power transistor. With reference to FIGS. 3 and 5 to 7, the transistor is electronically connected to the secondary side of the transformer 301 by a L-shaped drain plate 50. That is, at least two L-shaped drain plates 50 are vertically soldered on the main printed circuit board 20. The L-shaped drain plate 50 has a long side 51, a short side 52 and a connecting plate 521. The power transistor 321 is parallel to the long side 51 and the connecting plate 521 is extending from the top of the short side 52. The secondary side of the transformer 301 is directly soldered to the connecting plate 521 of the L-shaped drain plate 50, as shown in FIG. 5. Since a drain of the power transistor 321 has to be electronically connected to the corresponding inductor 322, one end of the inductor 322 is directly soldered to the long side of the L-shaped drain plate 50, as shown in FIG. 7. The other end of the inductor 322 is directly soldered to the sub-printed circuit board 21 to be electronically connected to the corresponding output capacitor 323. Therefore, the trace wires for the transformers, the power transistors, the indicators and the output capacitors are not formed on the main printed circuit board.

To further have good connecting strength between the L-shaped drain plate 50 and the inductor 322, the long side 51 of the L-shaped drain plate 50 further has a soldering plate 511 laterally extending from the top of the long side 51. The soldering plate 511 is defined at least one thermal resistance hole 512. The thermal resistance hole 512 of the soldering plate 512 keeps soldering heat in a high temperature so that the end of the inductor 322 can be easily soldered on the soldering plate 511 with high heat dissipating effectiveness.

To increase heat-dissipating effectiveness of the L-shaped drain plate 50 for the power transistor 321, a T-shaped heat sink 60 is sandwiched in between the two opposite L-shaped drain plates 50. The T-shaped heat sink 60 has a vertical side 61 and a horizontal side 62. The vertical side 61 is sandwiched in between the two long sides 51 of the two opposite L-shaped drain plates 60 and is further screwed into the two long sides 61. The horizontal side 62 is screwed into the vertical side 61 and located above the two tops of the long sides 51 of the two L-shaped drain plates 50.

The distance between the power transistor 321 and the inductor 322 is effectively reduced by the L-shaped drain plate 50. In addition, the inductors 322 are parallel to the power transistors 321 and the long side 51. The distance between the power transistor 321 and the inductor 322 is further shortened.

Based on foregoing description, in order to implement compact server power supply having high power density, the output capacitors and the ORing MOSFETs are moved to the sub-printed circuit board from the main printed circuit board to shorten the length of the main printed circuit board. Further, the height of the sub-circuit board is not higher than that of the transistor, so the height of the server power supply is not increased. The present invention provides a compact server power supply, and the power density of the server power supply using the same power supply circuit is increased.

In addition, the trace wires for the transformer and the secondary side circuit unit are not necessary formed on the main printed circuit board, so as to shorten the length of the main printed circuit board. Further, the output capacitor is electronically connected to the high voltage potential and ground of DC power through the first and second metal boards. The wave-filtering effectiveness is increased. The thickness of the first or second metal plate can be selected according to electronic specification of current and heat without changing the main printed circuit board, resulting in low current conductive loss. The first and second metal plates also provide good heat-dissipating capability.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A compact server power supply having high power density, comprising:
    a casing;
    a main printed circuit board mounted inside the casing and having two opposite short sides and a trace layout thereon, wherein the trace layout has trace wires, a first trace patterns of high voltage potential and ground;
    a sub-printed circuit board vertically mounted on and soldered to the main printed circuit board;
    a power supplying circuit having at least one primary side circuit unit, at least one transformer and at least one secondary side circuit unit, wherein electronic elements of the at least one primary side circuit unit, the at least one transformer and electronic elements of the at least one secondary side circuit unit are soldered on the main printed circuit board, except parts of the electric elements of the secondary side circuit unit are soldered on the sub-printed circuit board;
    a power output terminal set mounted on one short side of the main printed circuit board and soldered to the trace pattern of a high voltage potential and the trace pattern of ground; and
    at least one fan mounted on the other short side of the main printed circuit board.

2. The compact server power supply as claimed in claim 1, wherein each of the at least one secondary side circuit unit comprises:
    at least one current doubler, each of which has two electric switches, two inductors and one output capacitor, wherein the electric switches and inductors are soldered to the main printed circuit board, and the output capacitor soldered to the sub-printed circuit board; and
    at least one ORing MOSFET soldered to the sub-printed circuit board.

3. The compact server power supply as claimed in claim 1, wherein the transformer is a central-tapped transformer and each of the at least one secondary side circuit unit comprises:
    at least one full wave rectifier, each of which has two electric switches, an inductor and one output capacitor, wherein the electric switches and the inductor are soldered to the main printed circuit board, and the output capacitor soldered to the sub-printed circuit board; and at least one ORing MOSFET soldered to the sub-printed circuit board.

4. The compact server power supply as claimed in claim 2, wherein
the main printed circuit board has a first and second metal plates vertically mounted on the main printed circuit, and respectively soldered to the first trace patterns of high voltage potential and ground; and
the sub-printed circuit board sandwiched in between the first and second metal plates and has two opposite sides, on which a second trace patterns of high voltage potential and ground of DC power source are respectively formed; wherein the second trace patterns of high voltage potential and ground are respectively soldered to the first and second metal plates.

5. The compact server power supply as claimed in claim 3, wherein
the main printed circuit board has a first and second metal plates vertically mounted on the main printed circuit, and respectively soldered to the first trace patterns of high voltage potential and ground; and
the sub-printed circuit board sandwiched in between the first and second metal plates and has two opposite sides, on which a second trace patterns of high voltage potential and ground of DC power source are respectively formed; wherein the second trace patterns of high voltage potential and ground are respectively soldered to the first and second metal plates.

6. The compact server power supply as claimed in claim 4, wherein the output capacitor of the at least one secondary side circuit unit are vertically soldered on the sub-printed circuit board and located above power output terminal set.

7. The compact server power supply as claimed in claim 5, wherein the output capacitor of the at least one secondary side circuit unit are vertically soldered on the sub-printed circuit board and located above power output terminal set.

8. The compact server power supply as claimed in claim 6, wherein multiple air flow recesses are defined on top of the sub-printed circuit board.

9. The compact server power supply as claimed in claim 7, wherein multiple air flow recesses are defined on top of the sub-printed circuit board.

10. The compact server power supply as claimed in claim 2, wherein the main printed circuit further has at least two parallel L-shaped drain plate, on which the at least two electric switches are respectively mounted, wherein each of the L-shaped drain plate has:
a long side on which the corresponding electric switch is mounted;
a short side vertically extending from the long side and having a top; and
a soldering plate extending from the top of the short side, on which a secondary side of the transformer is soldered.

11. The compact server power supply as claimed in claim 3, wherein the main printed circuit further has at least two parallel L-shaped drain plate, on which the at least two electric switches are respectively mounted, wherein each of the L-shaped drain plate has:
a long side on which the corresponding electric switch is mounted;
a short side vertically extending from the long side and having a top; and
a connecting plate extending from the top of the short side, on which a secondary side of the transformer is soldered.

12. The compact server power supply as claimed in claim 10, wherein each of the L-shaped drain plate further has:
a soldering plate laterally extending from a top of the long side, on which one end of the corresponding inductor is soldered; and
at least one thermal resistance hole defined on the soldering plate.

13. The compact server power supply as claimed in claim 11, wherein each of the L-shaped drain plate further has:
a soldering plate laterally extending from a top of the long side, on which one end of the corresponding inductor is soldered; and
at least one thermal resistance hole defined on the soldering plate.

14. The compact server power supply as claimed in claim 12, wherein the main printed circuit further has at least one T-shaped heat sink sandwiched in between the two corresponding parallel L-shaped drain plates, and each of the at least one T-shaped heat sink has:
a vertical side sandwiched in between the two long sides of the two corresponding parallel L-shaped drain plates; and
a horizontal side located above the soldering plates of the two corresponding L-shaped drain plate.

15. The compact server power supply as claimed in claim 13, wherein the main printed circuit further has at least one T-shaped heat sink sandwiched in between the two corresponding parallel L-shaped drain plates, and each of the at least one T-shaped heat sink has:
a vertical side sandwiched in between the two long sides of the two corresponding parallel L-shaped drain plates; and
a horizontal side located above the soldering plates of the two corresponding L-shaped drain plate.

16. The compact server power supply as claimed in claim 14, wherein the horizontal side is screwed into the top of the vertical side.

17. The compact server power supply as claimed in claim 15, wherein the horizontal side is screwed into the top of the vertical side.

18. The compact server power supply as claimed in claim 1, wherein the casing comprises:
a base on which the main printed circuit board is mounted, and having a side opening facing the output power terminal set mounted on the main printed circuit board, and multiple heat-dissipating holes facing the at least one fan mounted on the main printed circuit board; and
a cover mounted on the base, and having an incline face corresponding to the side opening of the base and multiple through holes defining through the incline face.

19. The compact server power supply as claimed in claim 2, wherein the casing comprises:
a base on which the main printed circuit board is mounted, and having a side opening facing the output power terminal set mounted on the main printed circuit board, and multiple heat-dissipating holes facing the at least one fan mounted on the main printed circuit board; and
a cover mounted on the base, and having an incline face corresponding to the side opening of the base and multiple through holes defining through the incline face.

20. The compact server power supply as claimed in claim 17, wherein the casing comprises:
a base on which the main printed circuit board is mounted, and having a side opening facing the output power terminal set mounted on the main printed circuit board, and multiple heat-dissipating holes facing the at least one fan mounted on the main printed circuit board; and a cover mounted on the base, and having an incline face corresponding to the side opening of the base and multiple through holes defining through the incline face.

* * * * *